United States Patent
Lee

(10) Patent No.: US 9,646,698 B2
(45) Date of Patent: May 9, 2017

(54) SEMICONDUCTOR MEMORY DEVICE TUNNEL INSULATING LAYERS INCLUDED IN THE PLURALITY OF MEMORY CELLS HAVING DIFFERENT THICKNESSES ACCORDING TO DISTANCES OF THE PLURALITY OF MEMORY CELLS FROM THE X-DECODER

(71) Applicant: SK hynix Inc., Gyeonggi-do (KR)

(72) Inventor: Yeonghun Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/813,901

(22) Filed: Jul. 30, 2015

(65) Prior Publication Data

US 2016/0284410 A1    Sep. 29, 2016

(30) Foreign Application Priority Data

Mar. 25, 2015  (KR) .......................... 10-2015-0041374

(51) Int. Cl.
| | | |
|---|---|---|
| G11C 16/04 | (2006.01) | |
| G11C 16/08 | (2006.01) | |
| G11C 16/10 | (2006.01) | |
| H01L 27/11524 | (2017.01) | |
| H01L 27/11582 | (2017.01) | |

(52) U.S. Cl.
CPC .......... *G11C 16/08* (2013.01); *G11C 16/0483* (2013.01); *G11C 16/10* (2013.01); *H01L 27/11524* (2013.01); *H01L 27/11582* (2013.01)

(58) Field of Classification Search
USPC .......................... 365/185.28, 185.23, 230.06
IPC ..................... G11C 16/10,16/12; H01L 27/115
See application file for complete search history.

(56) References Cited

U.S. PATENT DOCUMENTS

| | | | | |
|---|---|---|---|---|
| 6,735,120 | B2* | 5/2004 | Homma | G11C 8/08 365/185.2 |
| 6,950,367 | B2* | 9/2005 | Kaneko | G11C 7/12 365/149 |
| 2009/0142896 | A1* | 6/2009 | Lee | H01L 21/823462 438/275 |
| 2010/0238709 | A1* | 9/2010 | Eun | G11C 8/10 365/148 |
| 2013/0155772 | A1* | 6/2013 | Leem | G11C 16/10 365/185.11 |

FOREIGN PATENT DOCUMENTS

KR    1020100077274    7/2010

* cited by examiner

*Primary Examiner* — Connie Yoha
(74) *Attorney, Agent, or Firm* — IP & T Group LLP

(57) ABSTRACT

A semiconductor memory device includes a plurality of memory cells and an X-decoder. The plurality of memory cells are connected to a word line. The X-decoder is connected to the word line, and applies an operating voltage to the word line. In the semiconductor memory device, tunnel insulating layers included in the plurality of memory cells have different thicknesses according to distances of the plurality of memory cells from the X-decoder.

4 Claims, 6 Drawing Sheets

SEMICONDUCTOR MEMORY DEVICE TUNNEL INSULATING LAYERS INCLUDED IN THE PLURALITY OF MEMORY CELLS HAVING DIFFERENT THICKNESSES ACCORDING TO DISTANCES OF THE PLURALITY OF MEMORY CELLS FROM THE X-DECODER

CROSS-REFERENCE TO RELATED APPLICATION

The present application claims priority to Korean patent application number 10-2015-0041374, filed on Mar. 25, 2015, the entire disclosure of which is herein incorporated in its entirety by reference.

BACKGROUND

Field of Invention

An aspect of the present invention relates to an electronic device, and more particularly, to a semiconductor memory device having improved threshold voltage distribution.

Discussion of Related Art

Semiconductor memory devices are generally classified into volatile memory devices and nonvolatile memory devices.

A volatile memory device performs a read/write operation at a high speed, but loses stored data when a power supply is cut off. Alternatively, a non-volatile memory device performs a read/write operation at a relatively low speed, but retains stored data even when a power supply is cut off. Accordingly, the non-volatile memory device is used to store data regardless of interruption of a power supply. Examples of the non-volatile memory device are a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like. Flash memories include NOR type flash memories and NAND type flash memories.

The flash memories have an advantage, for example, in a RAM, data is freely programmed and erased. An advantage for a ROM is that stored data is retained even when a power supply is cut off. Therefore, flash memories are widely used as a storage medium for portable electronic devices such as a digital camera, a personal digital assistant (PDA), and an MP3 player.

SUMMARY

Embodiments provide a semiconductor memory device with enhanced electrical characteristics, including improved threshold voltage distribution characteristics.

According to an aspect of the present invention, there is provided a semiconductor memory device, including: a plurality of memory cells connected to a word line; and an X-decoder connected to the word line, the X-decoder applying an operating voltage to the word line, wherein tunnel insulating layers included in the plurality of memory cells have different thicknesses according to distances of the plurality of memory cells from the X-decoder.

According to an aspect of the present invention, there is provided a semiconductor memory device, including: an X-decoder configured to apply a program voltage and a pass voltage to a plurality of word lines; and a memory cell array configured to include a plurality of cell strings, the memory cell array being connected to the plurality of word lines, wherein tunnel insulating layers of memory cells included in the plurality of cell strings have different thicknesses according to positions at which the plurality of cell strings are arranged.

According to an aspect of the present invention, there is provided a semiconductor memory device, including: an X-decoder configured to apply a program voltage and a pass voltage to a plurality of word lines; and a memory cell array configured to include a plurality of cell strings, the memory cell array being connected to the plurality of word lines, wherein channel plugs are formed having different widths according to positions at which the plurality of cell strings are arranged.

According to the present invention, the thickness of a tunnel insulating layer and the width of a channel plug in a memory cell, which have influence on the programming speed of the memory cell, are adjusted, so that it is possible to uniformly control the programming speed of memory cells having different word line resistances. Accordingly, the memory cells can be programmed with uniform threshold voltage distribution, thereby enhancing electrical characteristics of the semiconductor memory device.

BRIEF DESCRIPTION OF THE DRAWINGS

Example embodiments will now be described more fully hereinafter with reference to the accompanying drawings; however, the present invention may be embodied in different forms and should not be construed as limited to the embodiments set forth herein.

In the drawings, dimensions may be exaggerated for clarity of illustration. It will be understood that when an element is referred to as being "between" two elements, it can be the only element between the two elements, or one or more intervening elements may also be present. Like reference numerals refer to like elements.

DETAILED DESCRIPTION

In the following detailed description, embodiments of the present invention have been shown and described for an exemplary purpose only. Accordingly, the drawings and description are to be regarded as illustrative in nature and not restrictive.

Throughout the specification, when an element is referred to as being "connected to" another element, it can be directly connected to another element or be indirectly connected to another element with one or more intervening elements interposed therebetween.

Figure 1:
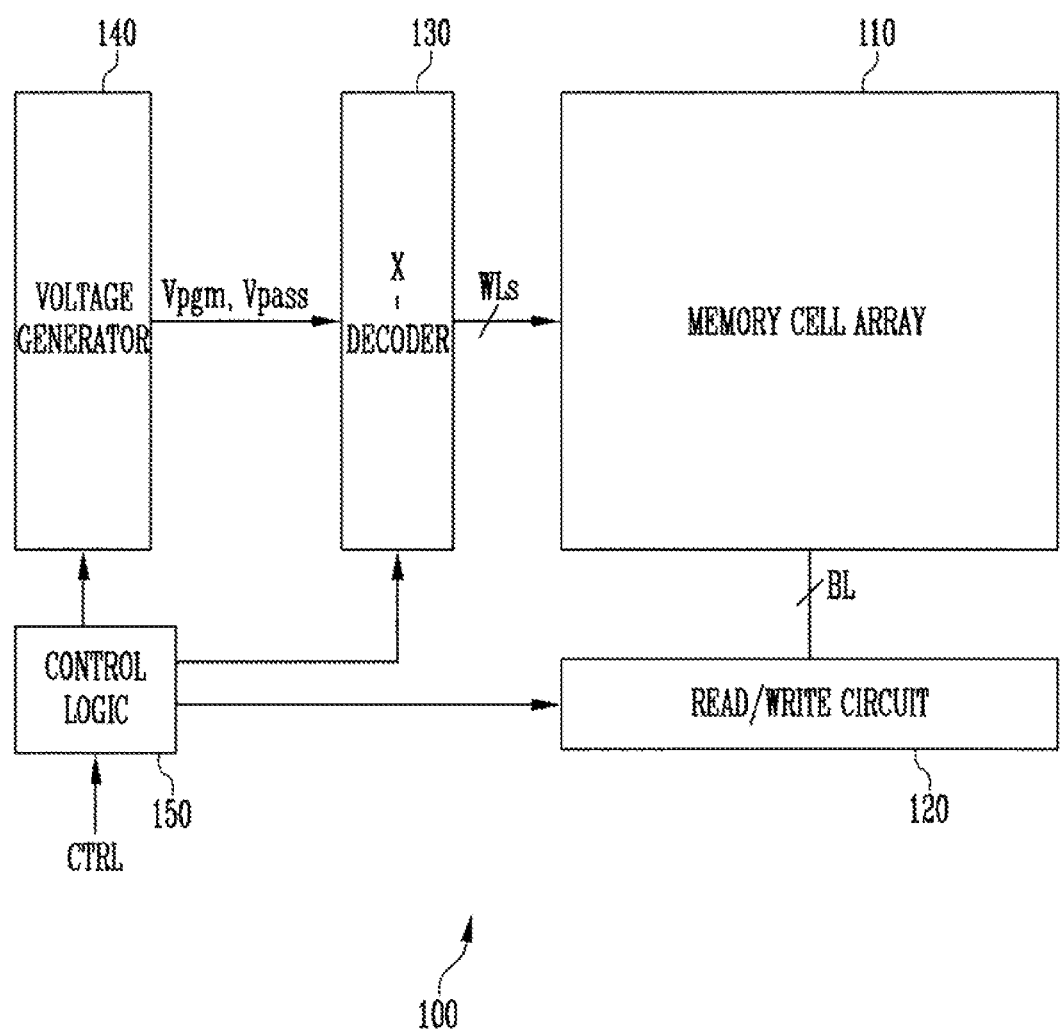
FIG. 1 is a block diagram illustrating a semiconductor memory device according to an embodiment of the present invention.

FIG. 1 is a block diagram illustrating a semiconductor memory device 100 according to an embodiment of the present invention.

Referring to FIG. 1, the semiconductor memory device 100 includes a memory cell array 110, a read/write circuit 120, an X-decoder 130, a voltage generator 140, and a control logic 150.

The memory cell array 110 is connected to the X-decoder 130 through a plurality of word lines WLs. The memory cell array 110 is connected to the read/write circuit 120 through bit lines BL.

The memory cell array 110 includes a plurality of memory cells. The memory cell array 110 includes a plurality cell strings. Each of the plurality of cell strings includes a plurality of memory cells stacked on a substrate. As an embodiment, the plurality of memory cells may be nonvolatile memory cells. The plurality of cell strings included in the memory cell array 110 has different distances from the X-decoder according to positions at which they are arranged. Therefore, the word lines WLs connecting the cell strings to the X-decoder 130 have different lengths. That is, the length of a word line connected to a cell string adjacent to the X-decoder 130 is shorter than the length a word line connected to a cell string located far from the X-decoder 130. Thus, the cell strings correspond to different word line resistances. Accordingly, when a program voltage is applied to the word lines in a programming operation, the program voltage applied to the cell string located adjacent to the X-decoder 130 has a potential level higher than that applied to the cell string located far from the X-decoder 130.

As an embodiment, each of the plurality of memory cells may be a single-level cell or a multi-level cell. The memory cell array 110 will be described in detail with reference to FIGS. 2 to 5. The read/write circuit 120, the X-decoder 130, and the voltage generator 140 operate as peripheral circuits that drive the memory cell array 110.

The reed/write circuit 120 is connected to the memory cell array 110 through the bit lines BL. The read/write circuit 120 operates in response to control of the control logic 150. In a programming operation, the read/write circuit 120 applies a program permission voltage to selected bit lines among the bit lines BL, and applies a program prohibition voltage to unselected bit lines. In programming and reading operations, the read/write circuit 120 may exchange data with an external device or an input/output buffer (not shown) in the semiconductor memory device 100. In an embodiment, the read/write circuit 120 may include a page buffers or page registers, a column select circuit, and the like.

The X-decoder 130 is connected to the memory cell array 110 through the plurality of word lines WLs. The plurality of word lines WLs includes drain select lines, word lines, and source select lines.

The X-decoder 130 is configured to drive the plurality of word lines WLs in response to control of the control logic 150. The X-decoder 130 selectively drives the plurality of word lines WLs according to an address input from an external device or the input/output buffer (not shown) in the semiconductor memory device 100. For example, in a programming operation, the X-decoder 130 applies a program voltage Vpgm to a selected word line among the plurality of word lines WLs, and applies a pass voltage Vpass to unselected word lines.

The voltage generator 140 is configured to generate the program voltage Vpgm, the pass voltage Vpass, and the like and supplies the voltages to the semiconductor memory device 100. The voltage generator 140 operates in response to control of the control logic 150.

In an embodiment, the voltage generator 140 may include a circuit that generates a power voltage by regulating an external voltage. For example, the voltage generator 140 may include a plurality of pumping capacitors and generate a plurality of voltages by selectively activating the plurality of pumping capacitors.

The control logic 150 is connected to the read/write circuit 120, the X-decoder 130, and the voltage generator 140. The control logic 150 receives a control signal CTRL from an external device or the input/output buffer (not shown) in the semiconductor memory device 100. The control logic 150 is configured to control the general operation of the semiconductor memory device 100.

The semiconductor memory device 100 may further include the input/output buffer (not shown). The input/output buffer may receive the control signal CTRL and the address from an external device, and transmit the received control signal CTRL and address to the control logic 150 and the X-decoder 130. The input/output buffer may transmit data received from an external device to the read/write circuit 120 and transmit data received from the read/write circuit 120 to an external device. In an embodiment, the semiconductor memory device 100 may be a flash memory device.

Figure 2:
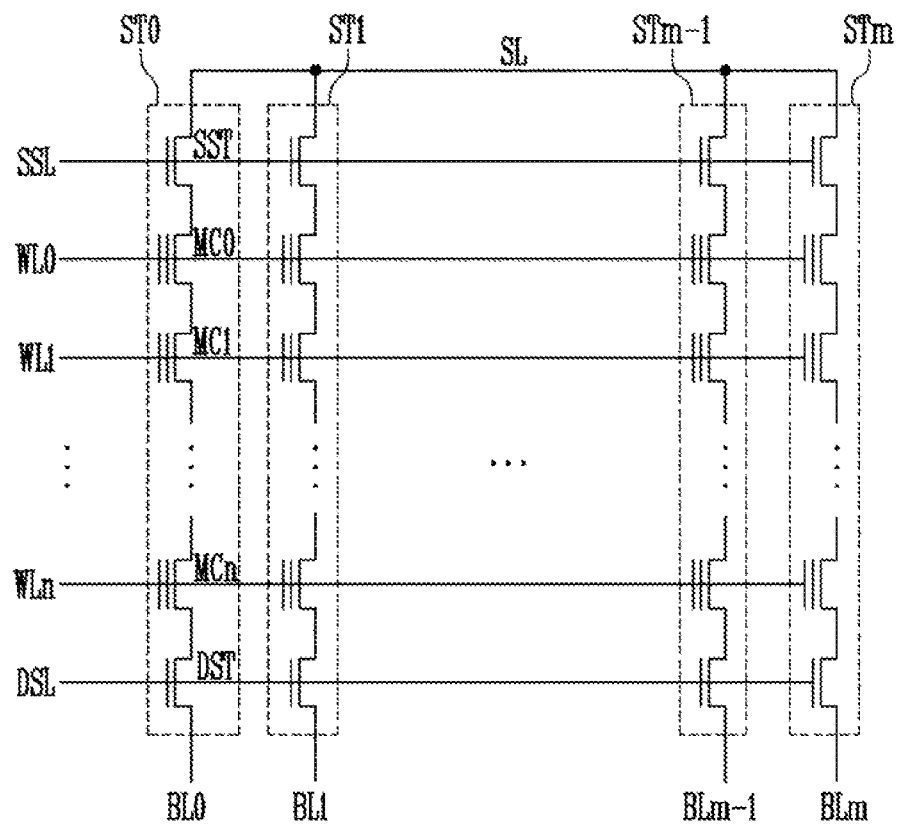
FIG. 2 is a circuit diagram illustrating a memory cell array of FIG. 1.

Referring to FIG. 2, the memory cell array 110 includes a plurality of cell strings ST0 to STm. The plurality of cell strings ST0 to STm are connected to a plurality of bit lines BL0 to BLm, respectively. Each of the plurality of cell strings ST0 to STm includes a source select transistor SST, a plurality of memory cells MC0 to MCn connected to each other in series, and a drain select transistor DST. The source select transistor SST is connected to a source select line SSL. The plurality of memory cells MC0 to MCn are connected to word lines WL0 to WLn, respectively. The drain select transistor DST is connected to a drain select line DSL. A source line SL is connected to a source of each source select transistor SST. Each of the bit lines BL0 to BLn is connected to a drain of a corresponding drain select transistor DST.

The plurality of word lines WLs described with reference to FIG. 1 include the source select line SSL, the word lines WL0 to WLn, and the drain selection line DSL. The source select line SSL, the word lines WL0 to WLn, and the drain selection line DSL are driven by the X-decoder 130. Although not shown in the drawings, the X-decoder 130 is disposed at one side of the memory cell array 110. For example, the X-decoder 130 may be disposed in an area adjacent to the cell string ST0.

Figure 3:
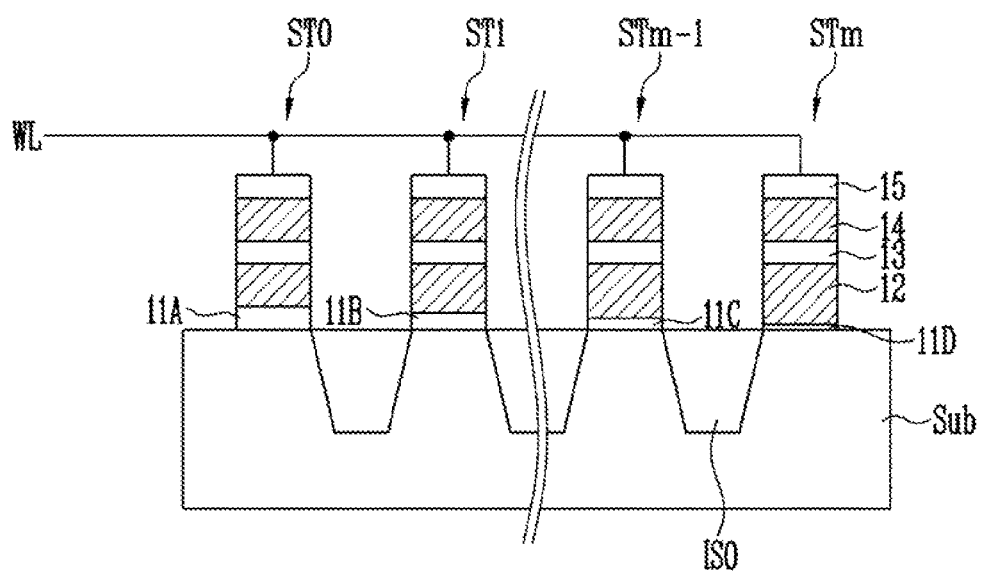
FIG. 3 is a sectional view of a semiconductor substrate illustrating a structure of memory cells.

FIG. 3 is a sectional view of a semiconductor substrate illustrating a structure of memory cells. Referring to FIG. 3, each of the memory cells included in a plurality of cell strings ST0 to STm has a structure in which a tunnel insulating layer 11A, 11B, 11C or 11D, a floating gate 12, a dielectric layer 13, a control gate 14, and a gate electrode 15 are stacked on the semiconductor substrate Sub. Also, device isolation layers ISO are formed in the semiconductor substrate Sub between the cell strings to isolate adjacent cell strings from each other.

In an embodiment of the present invention, the thicknesses of the tunnel insulating layers of memory cells connected to the same word line WL may be different from each other.

For example, the thickness of the tunnel insulating layer 11A of memory cells included in the cell string ST0 located close to the X-decoder may be formed different from that of the tunnel insulating layer 11D of memory cells included in the cell string STm located far from the X-decoder. In this structure, the thickness of the tunnel insulating layer of the memory cells included in the cell string ST0 close to the X-decoder is thickest. The farther the distance between a given cell string and the X-decoder is, the thinner the thickness of the tunnel insulating layer serving the memory cells included in the given cell string is.

As the thickness of the tunnel insulating layer becomes thinner, the programming speed of the memory cell becomes faster. As the distance of the cell string from the X-decoder increases, the length of a word line connected to the X-decoder becomes longer. Hence, resistance of the word line increases, and the programming speed of the memory cell decreases. However, this can be compensated for by adjusting the thickness of the tunnel insulating layer. It is possible to compensate for a change in threshold voltage distribution depending on a distance of the cell string from the X-decoder, thereby making threshold voltage distribution of the memory cells uniform.

Figure 4:
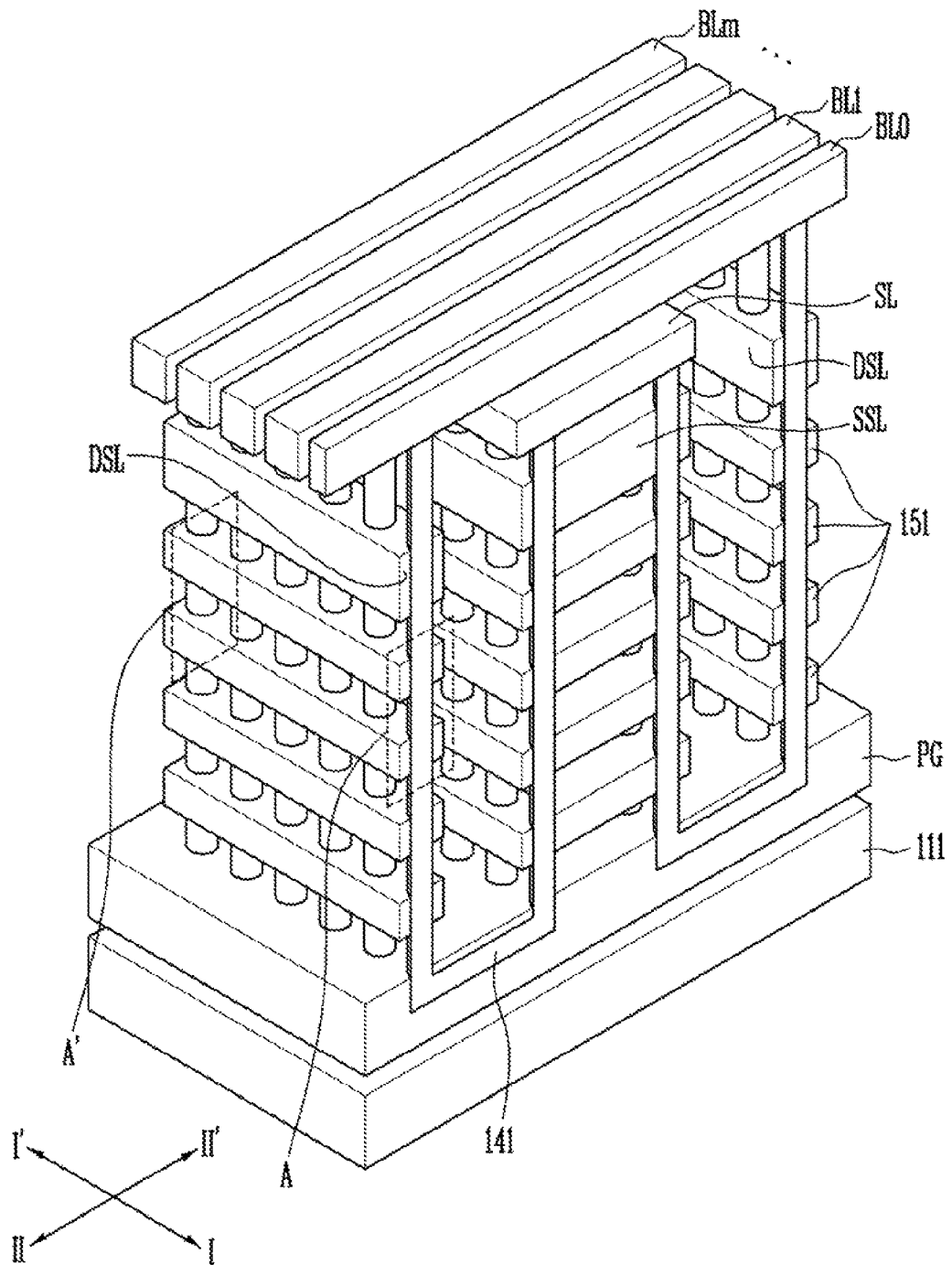
FIG. 4 is a perspective view illustrating a memory cell array with a three-dimensional structure according to an embodiment of the present invention.

FIG. 4 is a perspective view illustrating a memory cell array with a three-dimensional structure according to an embodiment of the present invention. Referring to FIG. 4, the memory cell array of the semiconductor memory device according to the present invention includes a pipe gate PG, a plurality of conductive patterns 151, at least one drain select line DSL, and at least one source select line SSL, which are stacked on a substrate 111, and a U-shaped through structure 141 passing through the plurality of conductive patterns 151 and the pipe gate PG.

The plurality of conductive patterns 151, the drain select line DSL, and the source select line SSL are stacked and each surround the through structure 141. The U-shaped through structure 141 is connected to bit lines BL0 to BLm and a source line SL.

According to the structure described above, a drain select transistor is formed at an intersection of the drain select line DSL and the through structure 141, and memory cells are formed at intersections of the plurality of conductive patterns 151 and the through structure 141. A pipe transistor is formed at an intersection of the pipe gate PG and the through structure 141, and a drain select transistor is formed at an intersection of the through structure 141 and the source select line SSL.

Accordingly, the drain select transistor, a plurality of memory cells, the pipe transistor, a plurality of memory cells, and the source select transistor, which are connected to each other in series, constitute a unit string, and strings are arranged in a U shape.

In an embodiment of the present invention, it has been described that the strings are arranged in a U shape. However, in another embodiment, a common source line may be formed on a semiconductor substrate, bit lines may be formed on the common source line, and a straight string may be formed between the bit lines and the common source line so that a semiconductor device having the straight string can be formed.

In FIG. 4, areas A and A' are used to refer to through structures. The distance between the area A and the X-decoder of FIG. 1 is different from the distance between the area A' and the X-decoder of FIG. 1. For example, when the X-decoder is disposed in direction I, a through structure (A) of the cell string connected to the bit line BL0 is disposed close to the X-decoder, and a through structure (A') of the cell string connected to the bit line BLm is disposed far from the X-decoder.

Figure 5:
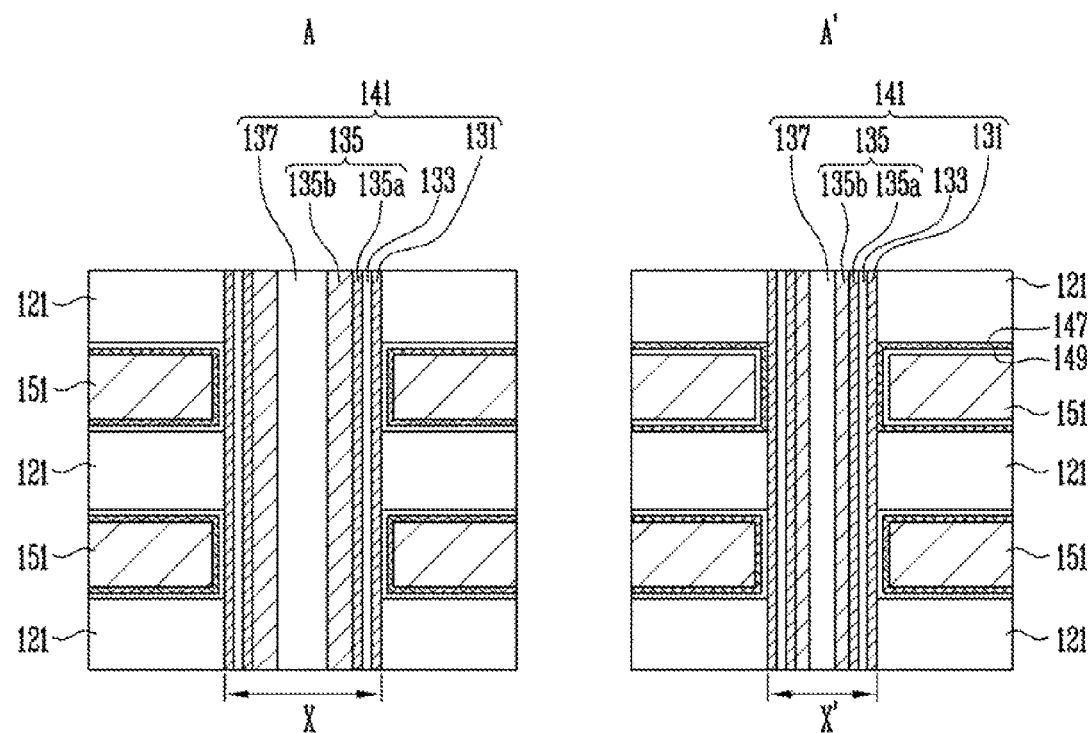
FIG. 5 is a sectional view illustrating a penetrating structure of the memory cell array shown in FIG. 4.

FIG. 5 is a sectional view illustrating a penetrating structure of the memory cell array shown in FIG. 4. Referring to FIG. 5, the through structure (A) 141 of the cell string close to the X-decoder includes a channel layer 135 having a multilayered structure that passes through insulating patterns 121 and the conductive patterns 151, which are alternately stacked, a tunnel insulating layer 133 configured to surround sidewalls of the channel layer 135, and a charge storage layer 131 configured to surround the tunnel insulating layer 133.

The channel layer 135 having the multilayered structure may include a first channel layer 135a and a second channel layer 135b. Also, a central region of the channel layer 135 may be filled with an insulating layer 137. The tunnel insulating layer 133 may be formed of a thermal oxide layer, a radical oxide layer, a dry oxide layer, a wet oxide layer, or a combination thereof. The charge storage layer 131 may be formed of a nitride layer. Also, a blocking insulating layer 147 and a barrier layer 149 may be further formed between the conductive patterns 151 and the through structure 141. The width of a channel plug of the through structure (A) 141 of the cell string adjacent to the X-decoder is referred to as X.

The through structure (A') 141 of the cell string distant from the X-decoder has substantially the same structure as the through structure (A) 141 of the cell string adjacent to the X-decoder. Here, the width of a channel plug of the through structure (A') 141 of the cell string distant from the X-decoder is referred to as X'. The width X' of the channel plug of the through structure (A') 141 of the cell string distant from the X-decoder is formed narrower than that of X of the through structure (A) 141 of the cell string adjacent to the X-decoder.

That is, the width of the channel plug of the through structure of the cell string adjacent to the X-decoder is formed relatively wider. As the distance of a cell string from the X-decoder increases, the width of the channel plug of the through structure of the cell string is narrower.

As the width of the channel plug becomes narrower, the programming speed of the memory cell becomes faster. As the distance of the cell string from the X-decoder increases, the length of a word line connected to the X-decoder becomes longer. Hence, resistance of the word line increases, and therefore, the programming speed of the memory cell decreases. However, this can be compensated for by adjusting the thickness of the tunnel insulating layer. Thus, it is possible to compensate for a change in threshold voltage distribution depending on a distance of the cell string from the X-decoder, thereby improving threshold voltage distribution characteristics of the memory cells.

Figure 6:
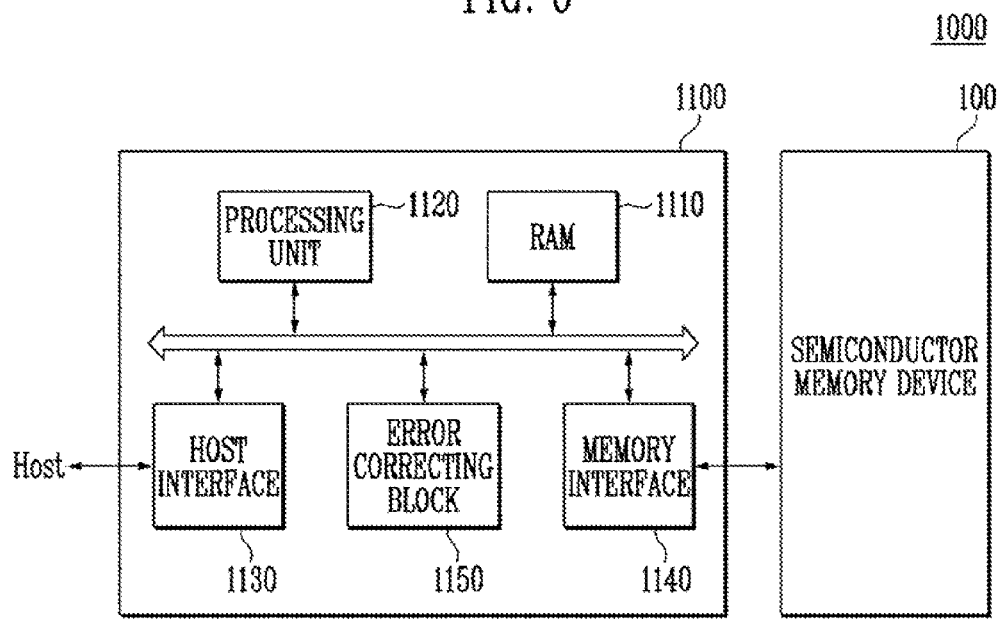
FIG. 6 is a block diagram illustrating a memory system including the semiconductor memory device of FIG. 1.

FIG. 6 is a block diagram illustrating a memory system including the semiconductor memory device of FIG. 1. Referring to FIG. 6, the memory system 1000 includes a semiconductor memory device 100 and a controller 1100.

The semiconductor memory device 100 is the same as the semiconductor memory device described with reference to FIG. 1. Hereinafter, descriptions of the same structure will be omitted for conciseness.

The controller 1100 is connected to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 includes a random access memory (RAM) 1110, a processing unit 1120, a host interface 1130, a memory interface 1140, and an error correcting block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls the general operation of the controller 1100. Also, the controller 1100 may temporarily store program data provided from the host Host in a writing operation.

The host interface 1130 includes a protocol for exchanging data between the host Host and the controller 1100. In an embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protoco an enhanced small disk interface (ESDI) protocol, an integrated drive electronics (IDE) protocol, and a private protocol.

The memory interface 1140 interfaces with the semiconductor memory device 100. For example, the memory interface 1140 may include a NAND interface or a NOR interface.

The error correcting block 1150 is configured to detect and correct an error of data received from the semiconductor memory device 100 by using an error correcting code (ECC). The processing unit 1120 may control the semiconductor memory device 100 to control a read voltage and perform a re-reading operation based on an error detection result of the error correcting block 1150. In an embodiment, the error correcting block 1150 may include the controller 1100.

The controller 1100 and the semiconductor memory device 100 may be integrated into a single semiconductor device. In an embodiment, the controller 1100 and the semiconductor memory device 100 may be integrated into one semiconductor device to constitute a memory card. For example, the controller 1100 and the semiconductor memory device 100 may be integrated into one semiconductor device to constitute a memory card such as a PC card (personal computer memory card international association (PCM-CIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1100 and the semiconductor memory device 100 may be integrated into one semiconductor device to constitute a semiconductor drive such as a solid state drive (SSD). The semiconductor drive SSD includes a storage device configured to store data in a semiconductor memory. If the memory system 1000 is used as the semiconductor drive SSD, the operating speed of the host connected to the memory system 2000 can be remarkably improved.

In another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telemetics network, an RFID device, or one of various components that constitute a computing system.

In an embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), system in package (SIP), multi chip package (MCP), wafer-level fabricated package (WFP), or wafer-level processed stack package (WSP).

Figure 7:
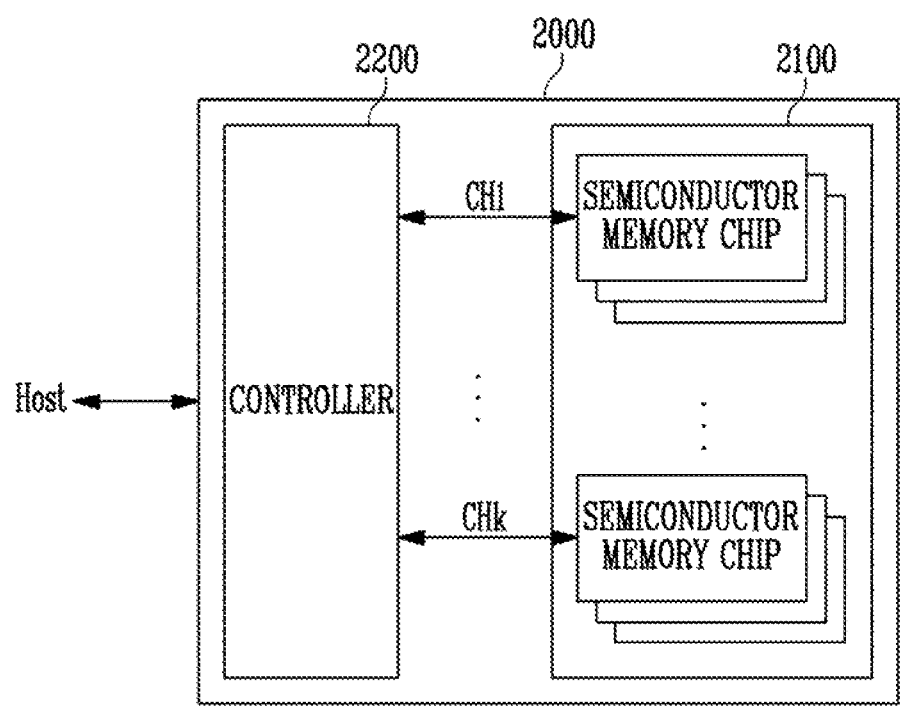
FIG. 7 is a block diagram illustrating an application example of the memory system of FIG. 6.

FIG. 7 is a block diagram illustrating an application example of the memory system of FIG. 6. Referring to FIG. 7, a memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 7, it is illustrated that the plurality of groups communicates with the controller 2200 through first to kth channels CH1 to CHk. Each semiconductor memory chip may be configured and operate in the same manner as the semiconductor memory devices 100 operate, which are described with reference to FIGS. 1 and 6.

Each group is configured to communicate with the controller 2200 through one common channel. The controller 2200 may include the controller 1100 described with reference to FIG. 6. The controller 2200 is configured to control the plurality of memory chips of the semiconductor memory device 2100 through the plurality of channels CH1 to CHk.

Figure 8:
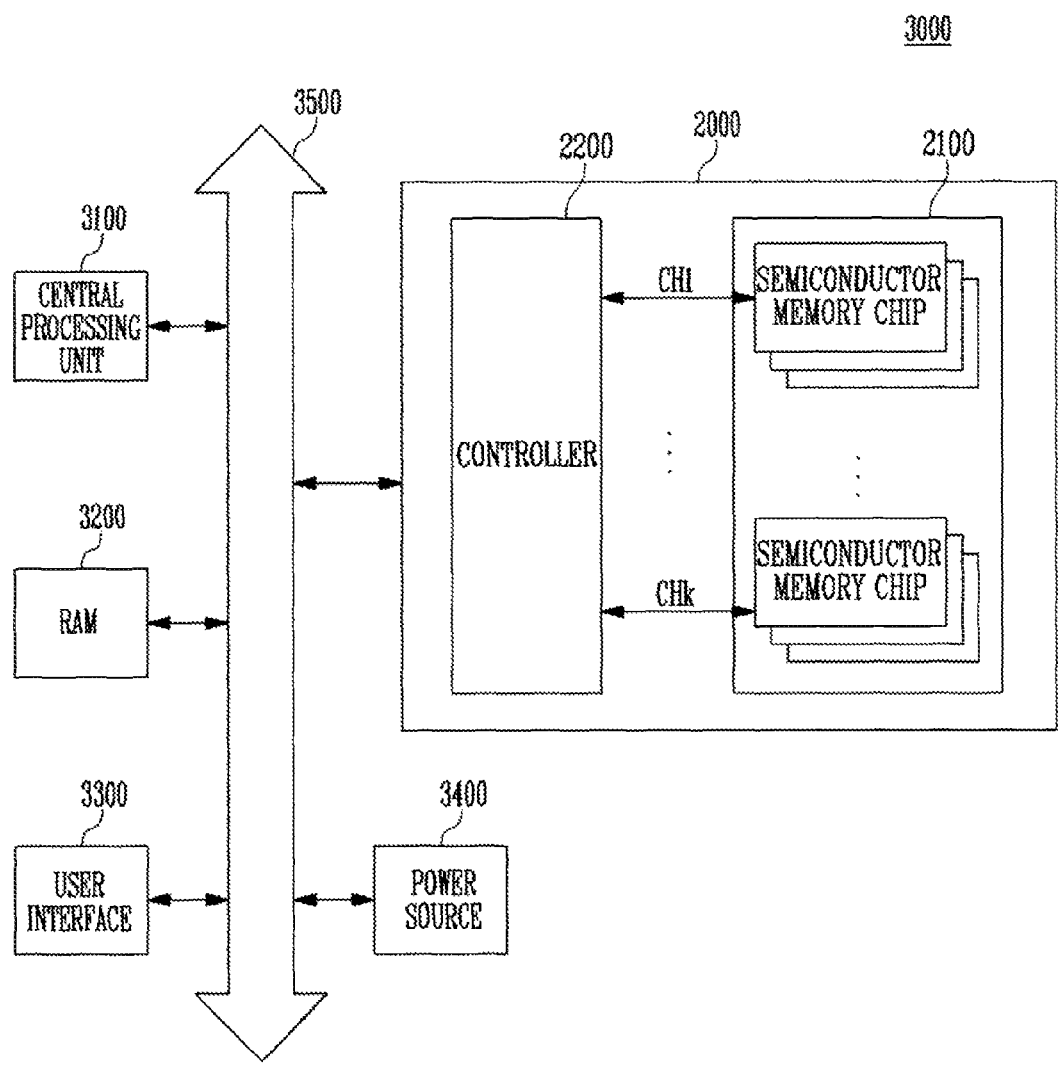
FIG. 8 is a block diagram illustrating a computing system including the memory system described with reference to FIG. 7.

FIG. 8 is a block diagram illustrating a computing system including the memory system described with reference to FIG. 7. Referring to FIG. 8, the computing system 3000 includes a central processing unit 3100, a random access memory (RAM) 3200, a user interface 3300, a power source 3400, a system bus 3500, and the memory system 2000.

The memory system 2000 is electrically connected to the central processing unit 3100, the RAM 3200, the user interface 3300, and the power source 3400 through the system bus 3500. Data supplied through user interface 3300 or data processed by the central processing unit 3100 are stored in the memory system 2000.

In FIG. 8, the semiconductor memory device 2100 is connected to the system bus 3500 through the controller 2200. However, in another embodiment, the semiconductor memory device 2100 may be directly connected to the system bus 3500. In this case, the function of the controller 2200 may be performed by the central processing unit 3100 and the RAM 3200.

In FIG. 8, the memory system 2000 described with reference to FIG. 7 is provided. However, in another embodiment, the memory system 2000 may be replaced by the memory system 1000 described with reference to FIG. 6. In yet another embodiment, the computing system 3000 may be configured to include both the memory systems 1000 and 2000 described with reference to FIGS. 7 and 6.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
   an X-decoder suitable for applying a program voltage and a pass voltage to a plurality of word lines; and
   a memory cell array including a plurality of cell strings, the memory cell array being connected to the plurality of word lines,
   wherein channel plugs are formed to different widths according to positions at which the plurality of cell strings are arranged, and
   wherein each of the plurality of cell strings includes:
      insulative patterns and conductive patterns which are alternately stacked;
      a channel layer that passes through the insulative patterns and the conductive patterns; and
      a tunnel insulating layer that surrounds sidewalls of the channel layer.

2. The semiconductor memory device of claim 1, wherein a width of a channel plug of a first cell string adjacent to the X-decoder is wider than a width of a channel plug of a second cell string which is located farther from the X-decoder than the channel plug of the first cell string.

3. The semiconductor memory device of claim 2, wherein a length of the word line connecting the X-decoder to the first cell string is shorter than that of the word line connecting the X-decoder to the second cell string.

4. The semiconductor memory device of claim 1, wherein a width of a channel plug of each of the plurality of cell strings becomes narrower as a distance of the cell strings from the X-decoder increases.

* * * * *